(12) United States Patent
Chong et al.

(10) Patent No.: US 12,237,301 B2
(45) Date of Patent: Feb. 25, 2025

(54) THROUGH STACK BRIDGE BONDING DEVICES AND ASSOCIATED METHODS

(71) Applicant: Micron Technology, Inc., Boise, ID (US)

(72) Inventors: Chin Hui Chong, Singapore (SG); Seng Kim Ye, Singapore (SG); Kelvin Tan Aik Boo, Singapore (SG); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 363 days.

(21) Appl. No.: 17/750,225

(22) Filed: May 20, 2022

(65) Prior Publication Data

US 2023/0378129 A1   Nov. 23, 2023

(51) Int. Cl.
*H01L 25/065* (2023.01)
*H01L 23/00* (2006.01)
*H01L 25/00* (2006.01)

(52) U.S. Cl.
CPC .......... *H01L 25/0652* (2013.01); *H01L 24/48* (2013.01); *H01L 24/49* (2013.01); *H01L 25/50* (2013.01); *H01L 2224/48011* (2013.01); *H01L 2224/48091* (2013.01); *H01L 2224/48147* (2013.01); *H01L 2224/48221* (2013.01); *H01L 2224/4903* (2013.01); *H01L 2224/49052* (2013.01); *H01L 2224/49177* (2013.01); *H01L 2225/06506* (2013.01); *H01L 2225/0651* (2013.01); *H01L 2225/06527* (2013.01); *H01L 2225/06562* (2013.01)

(58) Field of Classification Search
CPC ............................................ H01L 2225/06562
See application file for complete search history.

(56) References Cited

U.S. PATENT DOCUMENTS

| 2024/0079400 A1* | 3/2024 | Kim ................... H01L 24/48 |
| 2024/0113002 A1* | 4/2024 | Huang ................ H01L 21/565 |
| 2024/0179925 A1* | 5/2024 | Sung .................. H01L 25/18 |

* cited by examiner

*Primary Examiner* — Yu-Hsi D Sun
(74) *Attorney, Agent, or Firm* — Perkins Coie LLP

(57) ABSTRACT

A semiconductor package including a package substrate with an upper surface, a controller, and a die stack. The controller and the die stack are at the upper surface. The die stack includes a shingled sub-stack of semiconductor dies, a reverse-shingled sub-stack of semiconductor dies, and a bridging chip. The bridging chip is bonded between the shingled sub-stack and the reverse-shingled sub-stack, and has an internal trace. A first wire segment is bonded between the controller and a first end of the bridging chip, and a second wire segment is bonded between a second end of the bridging chip and each semiconductor die of the shingled sub-stack. The internal trace electrically couples the first and second wire segments. Additionally, a third wire segment is bonded between the controller and each semiconductor die of the reverse-shingled sub-stack.

20 Claims, 15 Drawing Sheets

1500

1502
Provide a package substrate having a controller

1504
Form a shingled die stack at the package substrate, the shingled die stack having a first die, consecutive dies, and a first bridging chip

1506
Bond a first wire segment between the controller and a first end of the first bridging chip

1508
Bond a second wire segment between a second end of the first bridging chip, the first die of the shingled die stack, and each consecutive dies of the shingled die stack

1510
Form a reverse-shingled die stack on the singled die stack, the reverse-shingled die stack having a second die, consecutive dies, and a second bridging chip

1512
Bond a third wire segment between the controller, the second die of the reverse-shingled die stack, and each consecutive dies of the reverse-shingled die stack

*FIG. 15*

THROUGH STACK BRIDGE BONDING DEVICES AND ASSOCIATED METHODS

CROSS-REFERENCE TO RELATED APPLICATION(S)

This application contains subject matter related to a concurrently-filed U.S. patent application by Seng Kim Ye et al., titled "CROSS STACK BRIDGE BONDING DEVICES AND ASSOCIATED METHODS." The related application is assigned to Micron Technology, Inc., and is identified by Ser. No. 17/750,200. The subject matter thereof is incorporated herein by reference thereto.

TECHNICAL FIELD

The present disclosure is generally related to systems and methods for semiconductor packages. In particular, the present technology relates to semiconductor packages having bridge bonding structures.

BACKGROUND

Microelectronic devices, such as memory devices, microprocessors, and other electronics, may include one or more semiconductor packages with semiconductor dies therein. The semiconductor packages include functional features, such as memory cells, processor circuits, interconnecting circuitry, etc. Semiconductor package manufacturers are under increasing pressure to reduce the volume occupied by semiconductor packages while increasing the capacity and/or speed of the resulting assemblies. To meet these demands, semiconductor package manufacturers often stack multiple semiconductor dies vertically on top of each other to increase the capacity or performance of the microelectronic devices within the limited area inside the semiconductor packages or other element to which the semiconductor dies and/or assemblies are mounted.

One method semiconductor package manufacturers use to reduce semiconductor device assembly volume is stacking multiple semiconductor dies vertically on top of each other in a shingled arrangement. This method retains exposed surface area from each semiconductor die, allowing wire connections to extend directly from each semiconductor die to the semiconductor package substrate. With each semiconductor die in direct connection with the semiconductor package substrate, overall capacity and performance of semiconductor packages may increase over microelectronic devices having a similar footprint. This is limited, however, by manufacturing capability to interconnect semiconductor dies and, despite its efficient inclusion of semiconductor dies, still presents significant unused space.

BRIEF DESCRIPTION OF THE DRAWINGS

FIG. 15 is a flow diagram illustrating a process for producing at least the semiconductor package of FIG. 3, in accordance with some embodiments of the present technology.

Figure 1:
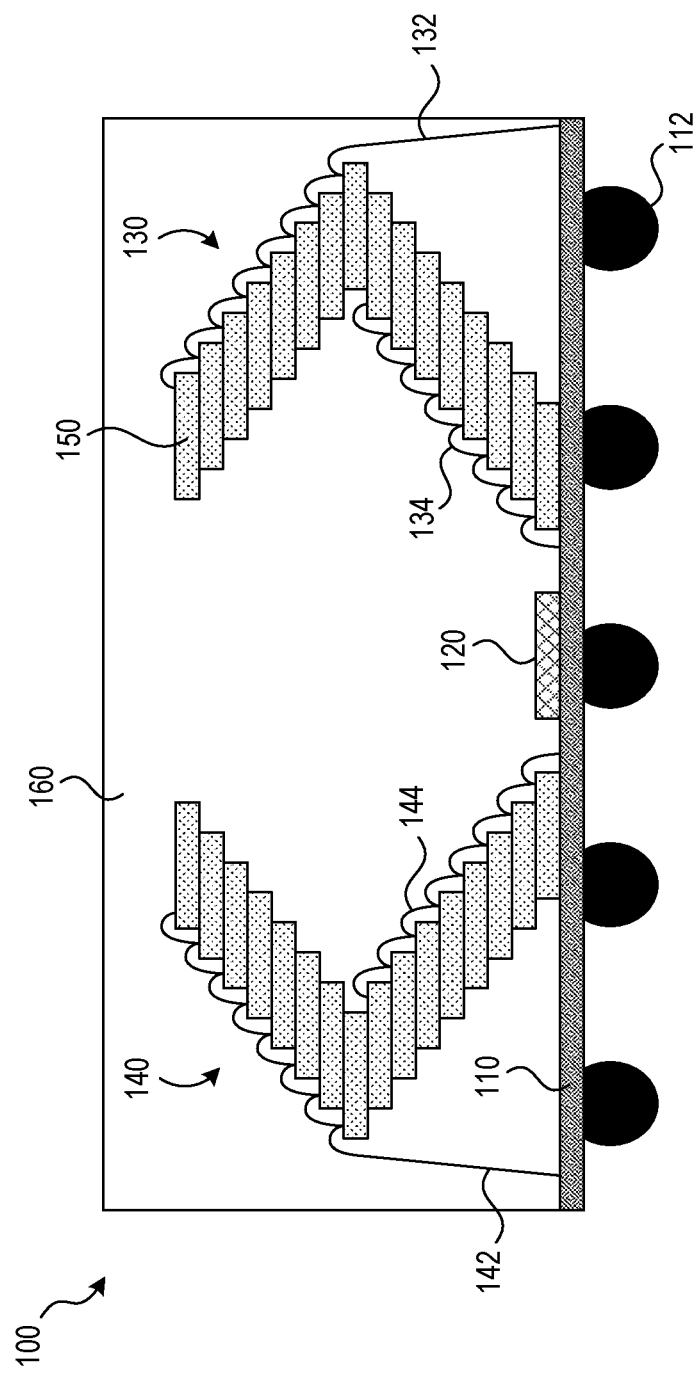
FIG. 1 is a side view of a semiconductor package with die stacks.

The drawings have not necessarily been drawn to scale. Similarly, some components and/or operations can be separated into different blocks or combined into a single block for the purpose of discussion of some of the implementations of the present technology. Moreover, while the technology is amenable to various modifications and alternative forms, specific implementations have been shown by way of example in the drawings and are described in detail below.

DETAILED OVERVIEW

The devices and methods of the present technology relate to semiconductor packages having bridge bonding structures for improving semiconductor packages. For example, the devices and methods of the present technology may allow for more efficient use of space within a semiconductor package and fewer connections between dies and a substrate of the semiconductor package. These improvements allow at least for (i) reducing unoccupied space within the semiconductor package and an overall semiconductor package footprint, (ii) reducing manufacturing costs given the semiconductor package size reduction, (iii) balancing signal integrity, (iv) preventing crosstalk between the front and back sides of the substrate, and (v) avoiding known and unknown manufacturing risks associated with manufacturing large semiconductor packages. Further, when dies of the semiconductor packages include power and ground connections via wirebond to a package substrate, the semiconductor packages can have improved die concurrency.

Specifically, a semiconductor device package, and associated assemblies and methods, are disclosed herein. In at least one embodiment, the semiconductor package includes a package substrate with an upper surface, a controller, and a die stack. The controller and the die stack are at the upper surface. The die stack includes a shingled sub-stack of semiconductor dies, a reverse-shingled sub-stack of semiconductor dies, and a bridging chip. The bridging chip is bonded between the shingled sub-stack and the reverse-shingled sub-stack, and has an internal trace. A first wire segment is bonded between the controller and a first end of the bridging chip, and a second wire segment is bonded between a second end of the bridging chip and each semiconductor die of the shingled sub-stack. The internal trace electrically couples the first and second wire segments. Additionally, a third wire segment is bonded between the controller and each semiconductor die of the reverse-shingled sub-stack.

In at least one embodiment, the semiconductor device package includes a package substrate with an upper surface, a controller, a shingled die stack, and a reverse-shingled die stack. The controller, the shingled die stack, and the reverse-shingled die stack are at the upper surface. The shingled die stack includes multiple semiconductor dies, a first bridging chip bonded to at least one of the semiconductor dies, a first wire segment bonded between the controller and a first end of the first bridging chip, and a second wire segment bonded between a second end of the first bridging chip and each semiconductor die of the shingled die stack. The reverse-shingled die stack includes multiple semiconductor dies, a second bridging chip bonded to at least one of the semiconductor dies, a third wire segment bonded between the controller and a first end of the second bridging chip, and a fourth wire segment bonded between a second end of the second bridging chip and each semiconductor die of the reverse-shingled die stack.

The semiconductor package may be manufactured by providing a package substrate having a controller and subsequently forming a shingled die stack and a reverse-shingled die stack, the die stacks having wire bonded between the die stacks and the controller. Forming the shingled die stack at the package substrate can comprise bonding a first die to the package substrate and consecutive dies to the first die with each consecutive die above and shingled relative to a previous die, and bonding the bridging chip to a last die of the consecutive dies of the shingled die stack. A first wire segment can be bonded between the controller and the first end of the bridging chip. A second wire segment can be bonded between the second end of the bridging chip, the first die of the shingled die stack, and each consecutive die of the shingled die stack. Forming the reverse-shingled die stack can comprise bonding the second die to the bridging chip and bonding consecutive dies to the second die with each consecutive die above and reverse-shingled relative to a previous die. A third wire segment can be bonded between the controller, the second die of the reverse-shingled die stack, and each consecutive die of the reverse-shingled die stack.

For ease of reference, the semiconductor package and the components therein are sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the stacked semiconductor device and the components therein can be moved to, and used in, different spatial orientations without changing the structure and/or function of the disclosed embodiments of the present technology.

DESCRIPTION OF THE FIGURES

FIG. 1 is a side view of a semiconductor package 100 (the "package 100") with die stacks 130, 140 known in the art. As illustrated, the package 100 includes: (i) a package substrate 110 having connectors 112, (ii) a controller 120, (iii) die stacks 130, 140 coupled to the package substrate 110, each having multiple dies 150, and (iv) a mold material 160 encasing the package 100. Each die stack 130, 140 has a shingled sub-stack including the bottom eight dies 150 of the respective die stack 130, 140 and a reverse-shingled sub-stack including the top eight dies 150 of the respective die stack 130, 140. Each of the sub-stacks, and the dies 150 therein, are wire bonded to the package substrate 110 by the wires 132, 134, 142, 144. While the stacking, shingling, and reverse shingling of the dies 150 in the die stacks 130, 140 allows for a reduced semiconductor package footprint, the package 100 requires at least four wires 132, 134, 142, 144 to connect the dies 150 with the package substrate 110. Further, the package 100 has (i) significant unutilized space above the controller 120 and between and around each die stack 130, 140, (ii) increased risk for manufacturing defects associated with large semiconductor packages (e.g., coplanarity issues, package warpage, or solider joint reliability), and (iii) increased complexity associated with trace routing within the package substrate 110.

Figure 2:
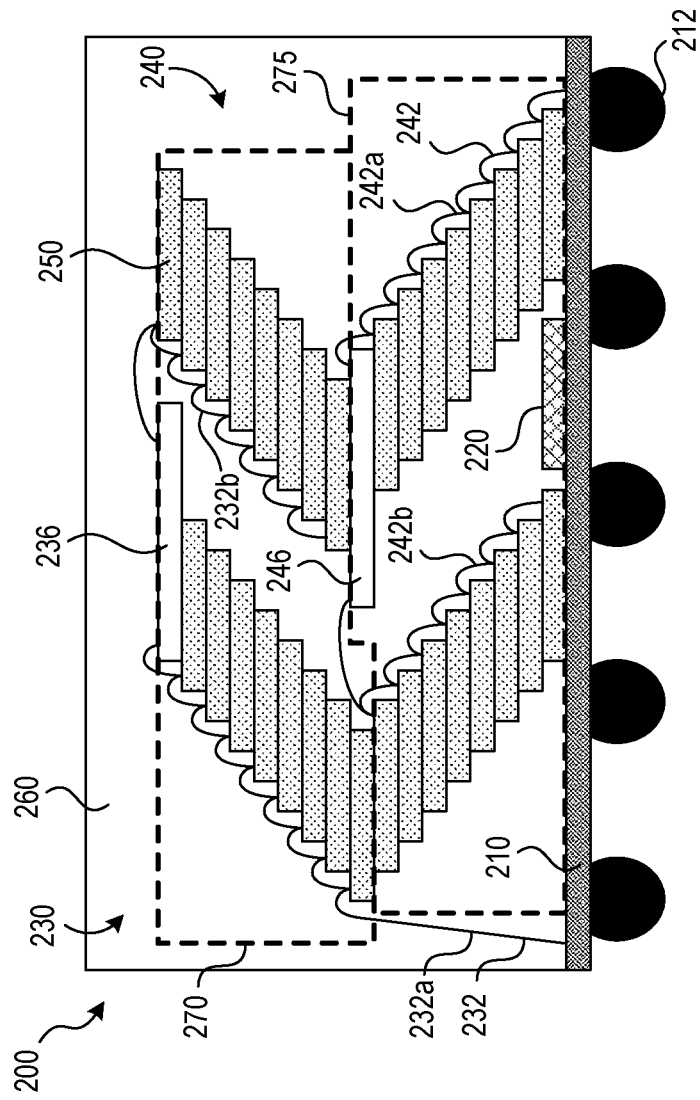
FIG. 2 is a side view of a semiconductor package with die stacks having cross stack bridge bonding, in accordance with some embodiments of the present technology.
Figure 3:
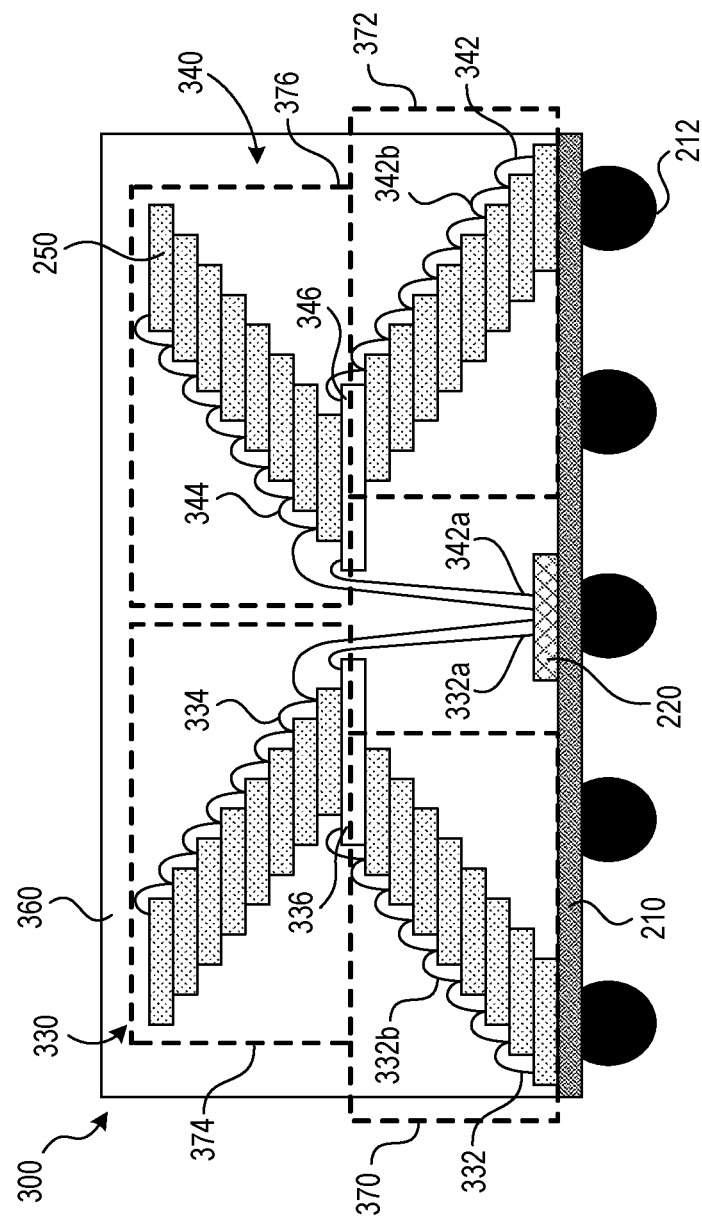
FIG. 3 is a side view of a semiconductor package with die stacks having cross stack bridge bonding, in accordance with some embodiments of the present technology.

FIGS. 2 and 3 are side views of semiconductor packages 200, 300 (the "packages 200, 300") with die stacks (e.g., die stacks 230, 240, 330, 340) having cross stack bridge bonding, in accordance with some embodiments of the present technology. More specifically, FIG. 2 illustrates at least one embodiment of the present technology and FIG. 3 illustrates at least another embodiment of the present technology. Aspects of the packages 200, 300 offer improved semiconductor structural and performance efficiency by allowing circuits (e.g., the wire segments 232a and 232b, 242a and 242b, 332a and 332b, and 342a and 342b) to continue on both a first and a second side of the die stacks. Specifically, a bridging chip (e.g., the bridging chips 236, 246, 336, 346) in each die stack allows the circuits to continue on both the first and second side of the die stacks. Further, by continuing circuits on both sides of the die stacks, each die stack benefits from the ability (e.g., flexibility) to bond wires between die stacks. Continuing circuits on both sides of the die stacks can allow for (i) balancing signal integrity, (ii) preventing crosstalk between the first and back sides of the substrate, and (iii) when dies 250 of the semiconductor packages 200, 300 include power and ground connections via wirebonds to the package substrate 210, the semiconductor packages 200, 300 can have improved die concurrency.

By continuing the circuits on both sides of the die stacks, space occupied by the die stacks may be used more efficiently and fewer connections may be required between the die stacks and a package substrate (e.g., package substrate 210), allowing the overall package footprint to be reduced. A reduced package footprint allows for reducing the size of devices where the packages 200, 300 are used or the implementation of additional packages 200, 300 within these devices. For example, the packages 200, 300 can provide an overall reduction in package footprint as compared to the package 100 of FIG. 1 between 20% and 45% (e.g., a reduction from between, roughly, 230 mm$^2$ and 320 mm$^2$ to less than 180 mm$^2$). Further, the reduced package 200, 300 footprint allows at least for reducing manufacturing costs given the package size reduction and avoiding known and unknown manufacturing risks associated with manufacturing large semiconductor packages.

For example, in the embodiment shown in FIG. 2, the dies stacks 230, 240 may nest within one another, reducing the footprint needed for the package substrate 210. As a further example in the embodiment shown in FIG. 3, the die stacks 330, 340 may vertically overlap a controller 220, similarly reducing the footprint needed for the package substrate 210. Additionally, in both the embodiments shown in FIGS. 2 and 3, fewer connections are needed between the die stacks 230, 240, 330, 340 and the package substrate 210, further reducing the footprint of the overall package. For example, the embodiment of FIG. 2 may only have two or fewer connections with the package substrate 210. Further, the embodiment of FIG. 3 may have no connections with the package substrate 210, the die stacks 330, 340 instead connected directly with the controller 220. When the die stacks 330, 340 connect directly with the controller 220, otherwise necessary bond pads on the substrate 210 for electrically connecting the die stacks 330, 340 with the substrate 210 can be omitted. In these embodiments, die stacks 330, 340 (or one or more of the dies 250 therein) can be closer to an edge of the substrate 210 and allow for overall package size reduction. Similarly, when the die stacks 330, 340 connect directly with the controller 220, if bond pads on the substrate 210 for electrically connecting the die stacks 330, 340 with the substrate 210 are included but unused (e.g., when using a common substrate between multiple assemblies), wires can be omitted between the die stacks 330, 340 and the unused bond pads, conserving wire material.

Regarding the illustrated embodiment of FIG. 2, the package 200 includes: (i) a package substrate 210 having connectors 212; (ii) a controller 220; (iii) the die stacks 230, 240 coupled to the package substrate 210, each having multiple dies 250; (iv) bridging chips 236, 246, each with a trace therein; (v) wire segments 232a, 232b, 242a, 242b between the dies 250, the bridging chips 236, 246, and the package substrate 210; and (vi) a mold material 260 encasing the die stacks 230, 240, the bridging chips 236, 246, the wire segments 232a, 232b, 242a, 242b, and the controller 220. The wire segments 232a, 232b together with the trace within the bridging chip 236 may form a circuit 232; and the wire segments 242a, 242b together with the trace within the bridging chip 246 may form a circuit 242. The dies 250 may be in electric communication with the controller 220 via the circuits 232, 242 and the package substrate 210. The dies 250 may further be in electric communication with elements outside the package 200, byway of the circuits 232, 242 and the package substrate 210 or the controller 220, via the connectors 212.

The package substrate 210 may include an upper surface and a lower surface opposite the upper surface. The controller 220 may be bonded to the upper surface and in electric communication with the package substrate 210. In some embodiments, the package 200 may instead exclude the controller 220. The package substrate 210 may include substrate bond pads on the upper and lower surfaces. The wires segments 232a, 242a may be bonded with the package substrate 210 at the bond pads on the upper surface. The connectors 212 (e.g., solder balls) may be bonded with the package substrate 210 at the bond pads on the lower surface. In some embodiments, the package substrate 210 can include conductive and dielectric materials, such as, for example, silicon, organic, ceramic, similar materials, or a combination thereof. In some embodiments, the connectors 212 can be formed from a suitable conductive metal (or metal plating), such as copper, gold, silver, aluminum, tungsten, cobalt, nickel, or any other suitable conductive material formed using an additive process, including, but not limited to, plating, depositing, or any other suitable method of manufacture for forming the connectors 212 on the package substrate 210.

Each die stack 230, 240 may have a generally chevron outline allowing for overlapping, nesting, or similar efficient structural arrangement of adjacent die stacks 230, 240, reducing overall package footprint. The chevron outline may be formed by a combination of shingled and reverse-shingled dies 250. Each die stack 230, 240 may include a shingled sub-stack having the bottom eight dies 250 of die stack 230, 240, respectively. In the shingled sub-stacks, dies 250 may be stacked offset from the previous die 250 in a first direction (e.g., to the left, regarding FIG. 2), providing an exposed surface of each previous die 250. Each die stack 230, 240 may also include a reverse-shingled sub-stack having the top eight dies 250 of the die stack 230, 240, respectively. In the reverse-shingled sub-stacks, dies 250 may be stacked offset from the previous die 250 in a second direction (e.g., to the right, regarding FIG. 2), similarly providing an exposed surface of each previous die 250. Each die 250 may include a bond pad at the exposed surface for connecting with the wire segments 232a, 232b, 242a, 242b, respectively as illustrated in FIG. 2.

In some embodiments, the package 200 may include one or more additional die stacks or a single die stack generally corresponding with the die stacks 230, 240. Relative to FIG. 2, additional die stacks may be included to the right or left of the die stacks 230, 240 or may be included in front of or behind the die stacks 230, 240 (i.e., into or out of FIG. 2). In some embodiments, either or both of the die stacks 230, 240, or the sub-stacks therein, may include additional or fewer dies 250. For example, the die stacks 230, 240 may include fewer or more than sixteen dies 250 or the sub-stacks may include fewer or more than eight dies 250. In some embodiments, the die stacks 230, 240 may include additional or fewer sub-stacks, or may include multiple sub-stacks of the same orientation.

The dies 250 may each be a semiconductor die and, in various embodiments, may correspond with a memory die, a logic die, a controller die, or any other suitable kind of semiconductor die. Although only one bond pad and one wire segment 232a, 232b, 242a, 242b are visible for each die 250 as shown in the side view of FIG. 2, in some embodiments, each die 250 can further include multiple bond pads for connecting with additional wire segments or circuits, variously dedicated to signaling, power, ground, or another similar purpose. Further, in some embodiments, each wire segment 232a, 232b, 242a, 242b can include multiple sub-segments combine to constitute a single wire segment.

Each die stack 230, 240 may include one of the bridging chips 236, 246. The bridging chips 236, 246, in part, allow the circuits 232, 242 to continue on both the first and the second side of each of the die stacks 230, 240, respectively. Further, the bridging chips 236, 246 may allow additional circuits to continue on both the first and the second side of each of the die stacks 230, 240. For each circuit passing through the bridging chips 236, 246, the bridging chips 236, 246 may include a first end bond pad, a second end bond pad, and an electric connection (e.g., a trace) between the first and second end bond pads extending through the bridging chip 236, 246. The first and the second ends of the bridging chips 236, 246 may correspond with the first and the second sides of each die stack 230, 240, respectively. The first side of each die stack 230, 240 may be the side away from the controller 220 and the second side may be the side closest to the controller 220. The bridging chip 236 may be bonded to the top of the reverse-shingled sub-stack of the die stack 230. The bridging chip 246 may be bonded between the shingled sub-stack and the reverse-shingled sub-stack of the die stack 240.

In some embodiments, one or both of the dies stacks 230, 240 may include additional bridging chips 236, 246. Further, the bridging chips 236, 246 or additional bridging chips may be bonded between dies 250 within the shingled sub-stack or the reverse-shingled sub-stack. In some embodiments, the bridging chips 236, 246 may include conductive and dielectric materials, such as, for example, silicon, organic, ceramic, similar materials, or a combination thereof. In other embodiments, the bridging chips 236, 246 may correspond in construction and material with the package substrate 210, the controller 220, or one or more of the dies 250.

The dies 250 of each die stack 230, 240 may be in electric communication with other dies 250, the bridging chips 236, 246, the package substrate 210, or the controller 220 via connections with the circuits 232, 242. The circuits 232, 242, and the dies 250 connected thereto, may correspond with controller channels of the controller 220. For example, a controller channel 0 (the "first channel 270") may correspond with the circuit 232 and a controller channel 1 (the "second channel 275") may correspond with the circuit 242.

The first channel 270 may include the dies 250 within the reverse-shingled sub-stacks of the die stacks 230, 240 (i.e., the top eight dies 250 of each die stack 230, 240) and the second channel 275 may include the dies 250 within the shingled sub-stacks of the die stacks 230, 240 (i.e., the bottom eight dies 250 of each die stack 230, 240). In some embodiments, the first channel 270 and the second channel 275 may be reversed. Further, the package 200 may include one or more additional channels.

Regarding the first channel 270, the circuit 232 may connect the package substrate 210, the corresponding dies 250 of the die stacks 230, 240, and the bridging chip 236. Specifically, the wire segment 232a may be (i) bonded to the package substrate 210 at one of the bond pads on the upper surface of the package substrate 210, (ii) bonded to each of the dies 250 at the respective bond pad on the exposed surface, and (iii) bonded to the bridging chip 236 at the first end bond pad; and the wire segment 232b may be (i) bonded to the bridging chip 236 at the second end bond pad, and (ii) bonded to each of the dies 250 at the respective bond pad on the exposed surface (i.e., bridge bonding between the die stacks 230, 240). By connecting the package substrate 210, the corresponding dies 250 of the die stacks 230, 240, and the bridging chip 236, the circuit 232, byway of the trace within the bridging chip 236, allows for electric communication therebetween. Although wire segment 232a is illustrated as being bonded between the package substrate 210 and a lowermost die of the reverse-shingled sub-stack of the die stack 230 on the left side of the die stack 230, this portion of the wire segment 232a may be excluded and an additional wire segment may be included bonded between a bond pad on the upper surface of an uppermost die 250 of the die stack 240 and a bond pad on the upper surface of the package substrate 210 on the right side of the die stack 240.

Regarding the second channel 275, the circuit 242 may connect the package substrate 210, the corresponding dies 250 of the die stacks 230, 240, and the bridging chip 246. Specifically, the wire segment 242a may be (i) bonded to the package substrate 210 at one of the bond pads on the upper surface of the package substrate 210, (ii) bonded to each of the dies 250 at the respective bond pad on the exposed surface, and (iii) bonded to the bridging chip 246 at the first end bond pad; and the wire segment 242b may be (i) bonded to the bridging chip 246 at the second end bond pad, and (ii) bonded to each of the dies 250 at the respective bond pad on the exposed surface (i.e., bridge bonding between the die stacks 230, 240). By connecting the package substrate 210, the corresponding dies 250 of the die stacks 230, 240, and the bridging chip 246, the circuit 242, byway of the trace within the bridging chip 246, allows for electric communication therebetween. Although wire segment 242a is illustrated as being bonded between the package substrate 210 and a lowermost die of the die stack 240 on the right side of the die stack 240, this portion of the wire segment 242a may be excluded and an additional portion of wire segment 242b may be included bonded between a bond pad on the upper surface of a lowermost die 250 of the die stack 230 and a bond pad on the upper surface of the package substrate 210 on the right side of the die stack 230.

Regarding the illustrated embodiment of FIG. 3, the package 300 includes: (i) the package substrate 210 having connectors 212; (ii) the controller 220; (iii) the die stacks 330, 340 coupled to the package substrate 210, each having the multiple dies 250; (iv) bridging chips 336, 346, each with a trace therein; (v) wire segments 332a, 332b, 342a, 342b between the dies 250, the bridging chips 336, 346, and the controller 220; (vi) wires 334, 344 between the dies 250 and the controller 220; and (vii) a mold material 360 encasing the die stacks 330, 340, the bridging chips 336, 346, the wire segments 332a, 332b, 342a, 342b, the wires 334, 344, and the controller 220. The wire segments 332a, 332b together with the trace within the bridging chip 336 may form a circuit 332; and the wire segments 342a, 342b together with the trace within the bridging chip 346 may form a circuit 342. The dies 250 may be in electric communication with the package substrate 210 via the controller 220 and the circuits 332, 342 or the wires 334, 344. The dies 250 may further be in electric communication with elements outside the package 300, byway of the circuits 332, 342 or the wires 334, 344, the controller 220, and the package substrate 210 via the connectors 212. In some embodiments, each wire segment 332a, 332b, 342a, 342b can include multiple sub-segments combine to constitute a single wire segment.

The package substrate 210, the connectors 212, the controller 220, and the dies 250 of the embodiment of FIG. 3 may include all, some, or similar elements and may be similarly bonded together, like the package substrate 210, the connectors 212, the controller 220, and the dies 250 of the embodiment of FIG. 2, respectively. Regarding at least the embodiment of FIG. 3, however, the controller 220 may include an upper surface with bond pads thereon and the package substrate 210 may not include the bond pads on the upper surface of the package substrate 210. The wire segments 332a, 342a and wires 334, 344, therefore, may instead be bonded to and in electric communication with the controller 220. In some embodiments, the controller 220 may be excluded. In these embodiments, the package substrate 210 has bond pads on the upper surface that may be bonded with the wire segments 332a, 342a and the wires 334, 344. Although only one bond pad, one circuit 332, 342, and one wire 334, 344 are visible for each die 250 as shown in the side view of FIG. 3, in some embodiments, each die 250 can further include multiple bond pads for connecting with additional wire segments, circuits, or wires, variously dedicated to signaling, power, ground, or another similar purpose.

Each die stack 330, 340 may have a generally chevron outline allowing for overlapping, nesting, or similar efficient structural arrangement of adjacent die stacks 330, 340, reducing the overall package footprint. The chevron outline may be formed by a combination of shingled and reverse-shingled dies 250. The die stack 330 may include a reverse-shingled sub-stack having the bottom eight dies 250 of the die stack 330 and may also include a shingled sub-stack having the top eight dies 250 of the die stack 330. The die stack 340 may include a shingled sub-stack having the bottom eight dies 250 of the die stack 340 and may also include a reverse-shingled sub-stack having the top eight dies 250 of the die stack 340. In the shingled sub-stacks, dies 250 may be stacked offset from the previous die 250 in a first direction (e.g., to the left, regarding FIG. 3), providing an exposed surface of each previous die 250. In the reverse-shingled sub-stacks, dies 250 may be stacked offset from the previous die 250 in a second direction (e.g., to the right, regarding FIG. 3), similarly providing an exposed surface of each previous die 250. Each die 250 may include a bond pad at the exposed surface for connecting with at least one of the circuits 332, 342 or wires 334, 344, respectively as illustrated in FIG. 3.

In some embodiments, the package 300 may include one or more additional die stacks generally corresponding with the die stacks 330, 340. Relative to FIG. 3, the additional die stacks may be included to the right or left of the die stacks 330, 340 or may be included in front of or behind the die stacks 330, 340 (i.e., into or out of FIG. 3). In some embodiments, either or both of the die stacks 330, 340, or the sub-stacks therein, may include additional or fewer dies 250. For example, the die stacks 330, 340 may include fewer or more than sixteen dies 250 or the sub-stacks may include fewer or more than eight dies 250.

Each die stack 330, 340 may include one of the bridging chips 336, 346. The bridging chips 336, 346, in part, allow the circuits 332, 342 to continue on both the first and the second side of each die stack 330, 340, respectively. Further, the bridging chips 336, 346 may allow additional circuits to continue on both the first and the second side of each of the die stack 330, 340. For each circuit passing through the bridging chips 336, 346, the bridging chips 336, 346 may include a first end bond pad, a second end bond pad, and an electric connection (e.g., a trace) between the first and second end bond pads extending through the bridging chip 336, 346. The first and the second ends of the bridging chips 336, 346 may correspond with the first and the second sides of each die stack 330, 340, respectively. The first side of each die stack 330, 340 may be the side away from the controller 220 and the second side may be the side closest to the controller 220. The bridging chip 336 may be bonded between the reverse-shingled sub-stack and the shingled sub-stack of the dies stack 330. The bridging chip 346 may be bonded between the shingled sub-stack and the reverse-shingled sub-stack of the die stack 340.

In some embodiments, one or both of the dies stacks 330, 340 may include additional bridging chips 336, 346. Further, the bridging chips 336, 346 or additional bridging chips may be bonded between dies 250 within the shingled sub-stack or the reverse-shingled sub-stack. In some embodiments, the bridging chips 336, 346 may include conductive and dielectric materials, such as, for example, silicon, organic, ceramic, similar materials, or a combination thereof. In other embodiments, the bridging chips 336, 346 may correspond in construction and material with the package substrate 210, the controller 220, or one or more of the dies 250.

The dies 250 of each die stack 330, 340 may be in electric communication with other dies 250, the bridging chips 336, 346, the package substrate 210, or the controller 220 via connections with the circuits 332, 342 or wires 334, 344. The circuits 332, 342 or wires 334, 344 and the dies 250 connected thereto, may correspond with controller channels of the controller 220. For example, a controller channel 0 (the "first channel 370") may correspond with the circuit 332, a controller channel 1 (the "second channel 372") may correspond with the circuit 342, a controller channel 2 (the "third channel 374") may correspond with the wire 334, and a controller channel 3 (the "fourth channel 376") may correspond with the wire 344. The first channel 370 may include the dies 250 within the reverse-shingled sub-stack of the die stack 330 (e.g., the bottom eight dies 250 of the die stack 330), the second channel 372 may include the dies 250 within the shingled sub-stack of the die stack 340 (e.g., the bottom eight dies 250 of the die stack 340), the third channel 374 may include the dies 250 within the shingled sub-stack of the die stack 330 (e.g., the top eight dies 250 of the die stack 330), and the fourth channel 376 may include the dies 250 within the reverse-shingled sub-stack of the die stack 340 (e.g., the top eight dies 250 of the die stack 340). In some embodiments, one or more of the first channel 370, the second channel 372, the third channel 374, or the fourth channel 376 may be reordered or combine, either in-part or in-whole. Further, the package 300 may include one or more additional channels.

Regarding the first channel 370, the circuit 332 may connect the controller 220, the corresponding dies 250 of the die stack 330, and the bridging chip 336. Specifically, the wire segment 332a may be (i) bonded to the controller 220 at one of the bond pads on the upper surface of the controller 220, and (ii) bonded to the bridging chip 336 at the second end bond pad; and the wire segment 332b may be (i) bonded to the bridging chip 336 at the first end bond pad, and (ii) bonded to each of the dies 250 at the respective bond pad on the exposed surface (i.e., bridge bonding through die stack 330). By connecting the controller 220, the corresponding dies 250 of the die stack 330, and the bridging chip 336, the circuit 332, byway of the trace within the bridging chip 336, allows for electric communication therebetween.

Regarding the second channel 372, the circuit 342 may connect the controller 220, the corresponding dies 250 of the die stack 340, and the bridging chip 346. Specifically, the wire segment 342a may be (i) bonded to the controller 220 at one of the bond pads on the upper surface of the controller 220, and (ii) bonded to the bridging chip 346 at the second end bond pad; and the wire segment 342b may be (i) bonded to the bridging chip 346 at the first end bond pad, and (ii) bonded to each of the dies 250 at the respective bond pad on the exposed surface (i.e., bridge bonding through die stack 340). By connecting the controller 220, the corresponding dies 250 of the die stack 340, and the bridging chip 346, the circuit 342, byway of the trace within the bridging chip 346, allows for electric communication therebetween.

Regarding the third channel 374 and the fourth channel 376, the wire 334 and the wire 344, respectively, may connect the controller 220 and the corresponding dies 250 of the die stacks 330, 340. Specifically, the wire 334 may be bonded to the controller 220 at one of the bond pads on the upper surface of the controller 220 and bonded to each of the dies 250 at the respective bond pad on the exposed surface; and the wire 344 may be bonded to the controller 220 at one of the bond pads on the upper surface of the controller 220 and bonded to each of the dies 250 at the respective bond pad on the exposed surface. By connecting the controller 220 and the corresponding dies 250 of the die stacks 330, 340, the wires 334, 344 allow for electric communication therebetween.

In some embodiments, the package 300 may include one or more additional dedicated wires connected (i) from the package substrate 210 to one or more of the dies 250, (ii) from the package substrate 210 to the controller 220, (iii) from the controller 220 to one or more of the bridging chips 336, 346, or (iv) from the controller 220 to one or more of the dies 250 to form a dedicated circuit. The dedicated circuits may be dedicated to signaling, power, ground, or another similar purpose between dies 250 of one or more die stacks 330, 340. When the dedicated circuit is included, the package substrate 210 or controller 220 may include one or more additional bond pads on the upper surface. The additional bond pads on the package substrate 210 may be adjacent to one or both of the dies 250 bonded to the package substrate 210 and opposite the controller 220, or may be adjacent to the controller 220. The bridging chips 336, 346 may include a dedicated first end bond pad, a dedicated second end bond pad, and an electric connection (e.g., trace) therebetween specific to each dedicated circuit.

When the dedicated circuit is included with, for example, the die stack 330, a first dedicated wire segment may be (i) bonded to the bond pad on the upper surface of the package substrate 210, (ii) bonded to each dies 250 of the reverse-shingled sub-stack at a dedicated bond pad on the exposed surface, and (iii) bonded to a dedicated first end bond pad of the bridging chip 336, and a second dedicated wire segment may be (i) bonded to a dedicated second end bond pad of the bridging chip 336 and (ii) bonded to each die 250 of the shingled sub-stack at a dedicated bonded pad on the exposed surface. By connecting the package substrate 210, the corresponding dies 250 of the die stack 330, and the bridging chip 336, the dedicated circuit, byway of the trace within the bridging chip 336, allows for dedicated electric communication therebetween, bypassing the controller 220. A similar dedicated circuit may instead or also be included with the die stack 340 with similar bond connections between the package substrate 210, the dies 250, and the bridging chip 346.

In some embodiments, a dedicated circuit can also be connected with the controller 220. For example, a wire segment may extend (i) from the bond pad on the upper surface of the package substrate 210 to the controller, (ii) from the controller 220 to the second end bond pad of the bridging chip 336, (iii) from the second end bond pad of the bridging chip 336 to each die 250 in the top of the die stacks 330, and (iii) from the first end bond pad of the bridging chip 336 to each die 250 in the bottom of the die stacks 330. Likewise, a dedicated wire may instead or also be included with the die stack 340 with similar bond connections between the package substrate 210, the dies 250, and the bridging chip 346.

Further examples of the present technology may include semiconductor packages with a different number of die stacks, sub-stacks, or bridging chips. As a first example, a semiconductor package may include at least a first and a second die stack comprising one sub-stack each and a bridging chip bonded to the top of the first die stack (similar to the illustration of FIG. 5). A circuit may be established using a first wire segment bonded to (i) the package substrate 210, (ii) each of the dies 250 in the first die stack, and (iii) the first end pad of the bridging chip, and a second wire segment bonded to (i) the second end pad of the bridging chip and (ii) each of the dies 250 in the second die stack.

Additional die stacks may be laterally added to the example semiconductor package and may be combine with the circuit by an additional bridging chip bonded to the preceding die stack (e.g., the second die stack in the present example). To include additional lateral sub-stacks, a first additional wire segment may be bonded to (i) the second end pad of the bridging chip or the uppermost die 250 of the preceding die stack and (ii) the second end pad of the additional bridging chip, and a second additional wire segment may be bonded to (i) the first end pad of the additional bridging chip and (ii) each of the dies 250 in the additional die stack. All sub-stacks of the present example semiconductor package may be either shingled or reverse-shingled.

Figure 6:
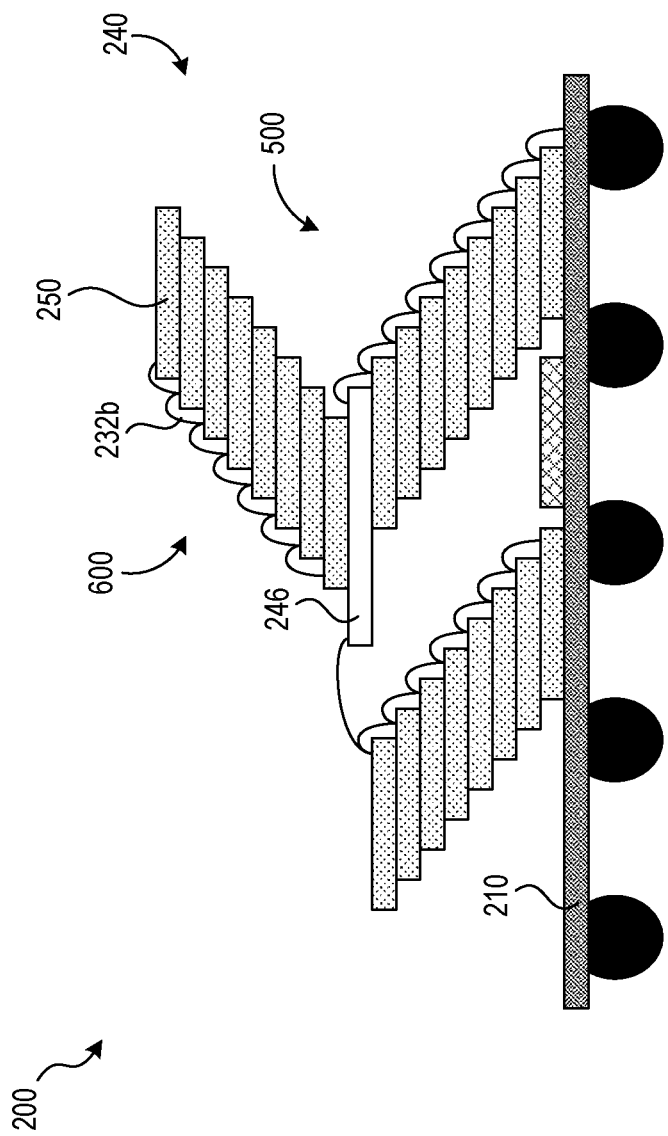
Figure 11:
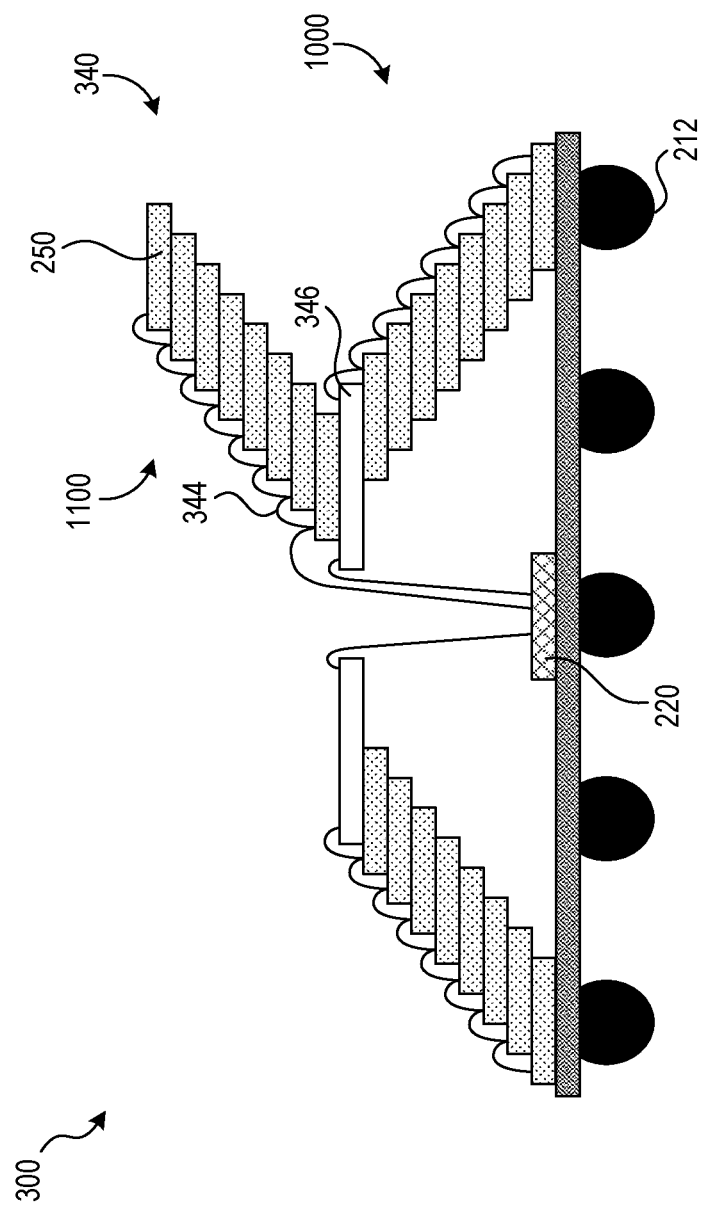

As a second example, a semiconductor package may include a single die stack comprising a bottom and a top sub-stack separated by a bridging chip (similar to sub-stacks 500, 600 of FIG. 6, or sub-stacks 1000, 1100 of FIG. 11). A lowermost die 250 of the top sub-stack may be offset in the first direction from the first end of the bridging chip and offset in the second direction from the second end of the bridging chip (e.g., the lowermost die 250 may be offset from both ends of the bridging chip or generally centered on the bridging chip). A circuit may be established using a first wire segment bonded to (i) the package substrate 210, (ii) each of the dies 250 in the bottom die stack, and (iii) the first end pad of the bridging chip, and a second wire segment bonded to (i) the second end pad of the bridging chip and (ii) each of the dies 250 in the top die stack.

Additional sub-stacks may be vertically added to the example semiconductor package and may be combine with the circuit by an additional bridging chip bonded to the preceding sub-stack (e.g., the top die stack in the present example). To include additional vertical sub-stacks, a first additional wire segment may be bonded to (i) the uppermost die of the preceding sub-stack and (ii) the first die end of the additional bridging chip, and a second additional wire segment may be bonded to (i) the second end pad of the additional bridging chip and (ii) each of the dies 250 in the additional sub-stack. All sub-stacks of the present example semiconductor package alternate between shingled or reverse-shingled. Further, portions or all of the first and second examples, or other embodiments herein, may be combine to establish a semiconductor package having varying die stack structures and circuits therein.

As a third example, a semiconductor package may include a package substrate (e.g., the package substrate 210), a first die stack and a second die stack (e.g., the die stacks 230, 240 of FIG. 2) coupled to the package substrate, wherein each of the first and the second die stack have multiple dies (e.g., the dies 250 of FIG. 2) and at least one bridging chip (e.g., the bridging chips 236, 246 of FIG. 2). Each bridging chip may include a first exposed portion on a first end and a second exposed portion on a second end, wherein each bridging chip can be electrically connected, by a wire segment, with at least some dies of the first die stack at the first exposed portion, and wherein each bridging chip can be electrically connected, by a wire segment, with at least some of the dies of the second die stack at the second exposed portion, thereby forming a circuit across die stacks associated with each bridging chip, respectively. By incorporating circuits across the die stacks using the bridging chips, the die stacks can be nested within one another and significantly reduce the overall footprint of the semiconductor package (e.g., a reduction of 20-45% over conventional semiconductor packages, such as the package 100 of FIG. 1). Further, signal integrity of the semiconductor package, overall, can be improved.

Further, in some embodiments of the third example, the bridging chip of the first die stack (e.g., the die stack 240 of FIG. 2) can be vertically aligned with at least an uppermost and a lowermost die of the second die stack (e.g., die stack 230 of FIG. 2). In this configuration, the first die stack is nested within the second die stack and therefore the overall footprint of the semiconductor package can be reduced.

As a fourth example, a semiconductor package may include a package substrate (e.g., the package substrate 210 of FIG. 3) and a first die stack (e.g., the die stack 340 of FIG. 3), wherein the first die stack includes multiple dies (e.g., the dies 250 of FIG. 3) and a first bridging chip (e.g., the bridging chip 346 of FIG. 3). The first bridging chip may include a first exposed portion on a first end and a second exposed portion on a second end, wherein the first bridging chip can be electrically connected, by a wire segment, with the dies of a bottom portion of the first die stack at the first exposed portion, and wherein the first bridging chip can be electrically connected, by a wire segment, with a controller (e.g., the controller 220 of FIG. 3) at the second exposed portion, thereby forming a circuit including the dies of the bottom portion of the first die stack. The dies of a top portion of the first die stack can similarly form a circuit by electrically connecting each of the dies directly to the controller. By incorporating multiple circuits in a single die stack in direct connection with the controller, the semiconductor package can benefit from more balanced signal integrity.

Further, in some embodiments of the fourth example, the controller can be at least partially nested under the bottom portion of the first die stack. For example, a portion of the first bridging chip can be vertically aligned with the controller. By nesting the controller under a portion of the first die stack the overall footprint of the semiconductor package can be reduced, contributing to an overall package size reduction of 20-45%, in some embodiments versus, conventional semiconductor packages.

Further, in some embodiments of the fourth example, a portion of an upper surface of the package substrate opposite the controller from the first die stack can be free of any bond pad or free of any bond pads to which a wire segment is bonded. That is, for example, no connection by wire segment is made between the bottom portion of the first die stack and the package substrate, opposite the first die stack from the controller. By excluding connections between the first die stack and the package substrate opposite the controller, a distance between the first die stack and an edge of the package substrate can be reduced, thereby allowing the overall footprint of the semiconductor package to be reduced, contributing to an overall package size reduction of 20-45%, in some embodiments, over conventional semiconductor packages.

Figure 7:
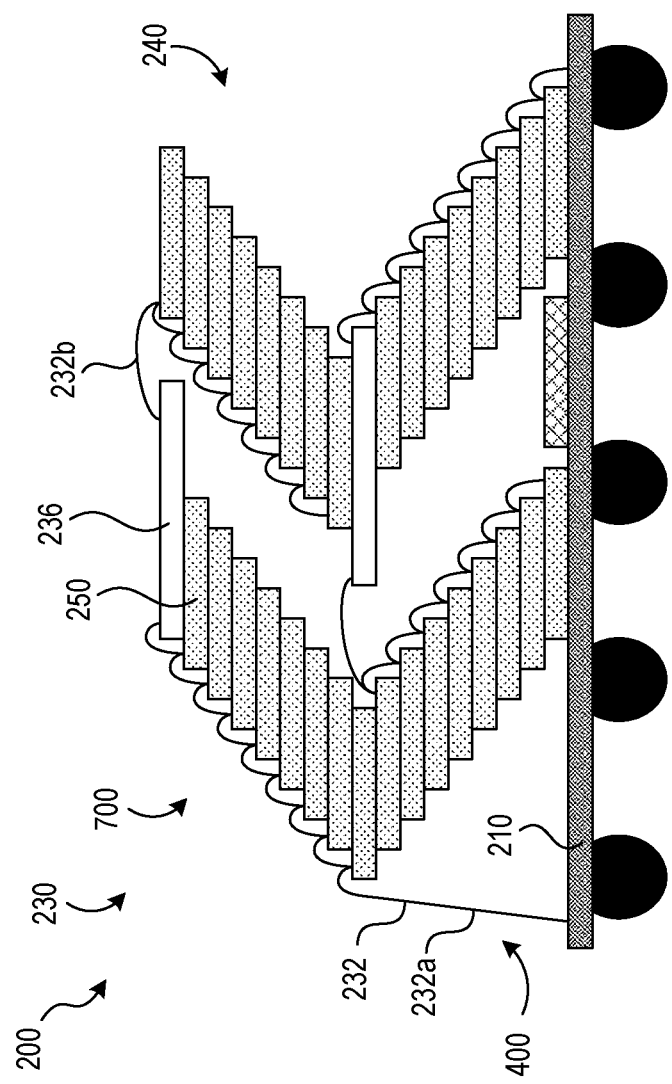

FIGS. 4-8 illustrate a process for producing at least the package 200 of FIG. 2 having cross stack bridge bonding in accordance with some embodiments of the present technology. The process may generally include preparing the package substrate 210 and forming the sub-stacks of the dies stacks 230, 240 in a counter clockwise order. For example, the sub-stacks can be formed in the following order: the shingled sub-stack (FIG. 4, 400), the shingled sub-stack (FIG. 5, 500), the reverse-shingled sub-stack (FIG. 6, 600), and the reverse-shingled sub-stack (FIG. 7, 700). More specifically, the process may include: (i) preparing the package substrate 210, (ii) bonding the shingled sub-stack (FIG. 4, 400) of the die stack 230 (FIG. 2) to the package substrate 210, (iii) bonding the wire segment 242b to each of the dies 250 in the shingled sub-stack 400, (iv) bonding the shingled sub-stack (FIG. 5, 500) of the die stack 240 (FIG. 2) to the package substrate 210, (v) bonding the wire segment 242a from the package substrate 210 to each of the dies 250 and the bridging chip 246 in the shingled sub-stack 500, and extending the wire segment 242b from the shingled sub-stack 400 to the bridging chip 246, (vi) bonding the reverse-shingled sub-stack (FIG. 6, 600) of the die stack 240 to the bridging chip 246, (vii) bonding the wire segment 232b to each die 250 of the reverse-shingled sub-stack 600, (viii) bonding the reverse-shingled sub-stack (FIG. 7, 700) of the die stack 230 to the top die of the shingled sub-stack 400, (ix) bonding the wire segment 232a from the package substrate 210 to each of the dies 250 and the bridging chip 236 in the reverse-shingled sub-stack 700, and extending the wire segment 232b from the reverse-shingled sub-stack 600 to the bridging chip 236, and (x) adding a molding material over the package 200 to form the mold material 260.

Figure 4:
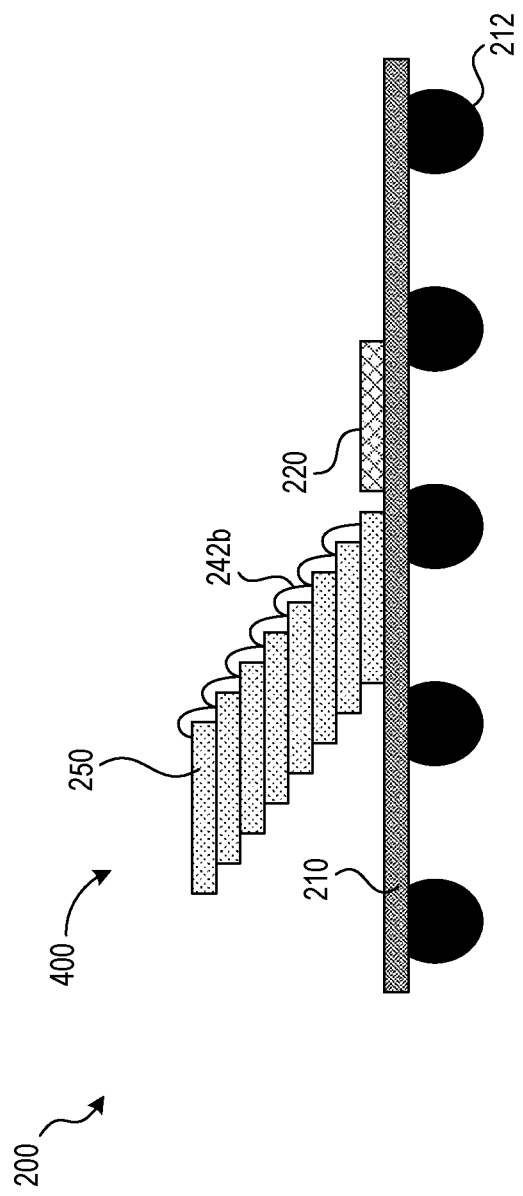
FIGS. 4-8 illustrate a process for producing at least the semiconductor package of FIG. 2, in accordance with some embodiments of the present technology.

FIG. 4 illustrates the package 200 after (i) preparing the package substrate 210, (ii) bonding the shingled sub-stack 400 of the die stack 230 (FIG. 2) to the package substrate 210, and (iii) bonding the wire segment 242b to each of the dies 250 in the shingled sub-stack 400. Preparing the package substrate 210 may include bonding the connectors 212 to the package substrate 210 at the bond pads on the lower surface of the package substrate 210 and bonding the controller 220 to the upper surface of the package substrate 210. Bonding the shingled sub-stack 400 to the package substrate 210 may first include bonding a lowermost die 250 (e.g., a bottom or first die) to the upper surface of the package substrate 210 adjacent to the controller 220. Next, the dies 250 may be consecutively bonded to the shingled sub-stack 400 offset from the lowermost or a previous die 250 in the first direction, exposing the bond pad of the lowermost or the previous die 250. After all dies 250 have been bonded to the package 200, forming the shingled sub-stack 400, the wire segment 242b may be formed, connecting the bond pads of each die 250 of the sub-stack 400.

Figure 5:
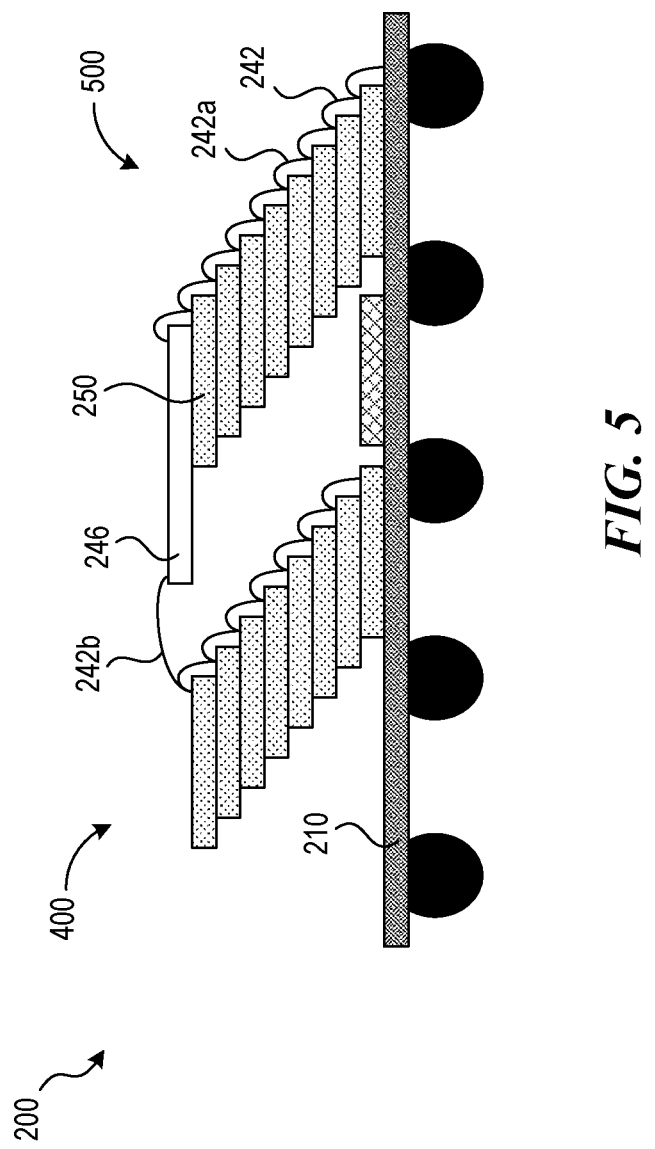

FIG. 5 illustrates the package 200 after (i) bonding the shingled sub-stack 500 of the die stack 240 (FIG. 2) to the package substrate 210, (ii) bonding the wire segment 242a from the package substrate 210 to each of the dies 250 and the bridging chip 246 in the shingled sub-stack 500, and (iii) extending the wire segment 242b from the shingled sub-stack 400 to the bridging chip 246. Bonding the shingled sub-stack 500 to the package substrate 210 may first include bonding a lowermost die 250 (e.g., a bottom or first die) to the upper surface of the package substrate 210 adjacent to the controller 220 and opposite the shingled sub-stack 400. Next, the dies 250 may be consecutively bonded to the shingled sub-stack 500 offset from the lowermost or a previous die 250 in the first direction, exposing the bond pad of the lowermost or the previous die 250.

After all dies 250 of the sub-stack 500 have been bonded to the package 200, the bridging chip 246 may be bonded to an uppermost die 250 (e.g., a top or last die) offset from the uppermost die 250 in the first direction and exposing the bond pad of the uppermost die 250. After the bridging chip 246 has been bonded to the uppermost die 250, forming the shingled sub-stack 500, the wire segment 242a may be formed. The wire segment 242a may connect one of the bond pads on the upper surface of the package substrate 210 with the bond pad of each die 250 of the shingled sub-stack 500 and the bond pad on the first end of the bridging chip 246. Further, the wire segment 242b may be extended to connect the bond pad of an uppermost die 250 of the shingled sub-stack 400 with the bond pad on the second end of the bridging chip 246, completing the circuit 242.

FIG. 6 illustrates the package 200 after bonding the reverse-shingled sub-stack 600 of the die stack 240 to the bridging chip 246 and bonding the wire segment 232b to each die 250 of the reverse-shingled sub-stack 600. Bonding the reverse-shingled sub-stack 600 to the bridging chip 246 may first include bonding a lowermost die 250 (e.g., a bottom or first die) to the upper surface of the bridging chip 246. The lowermost die 250 may be offset in the first direction from the first end of the bridging chip 246 and offset in the second direction from the second end of the bridging chip 246 (e.g., the lowermost die 250 may be offset from both ends of the bridging chip 246 or generally centered on the bridging chip 246). Next, the dies 250 may be consecutively bonded to the reverse-shingled sub-stack 600 offset from the lowermost or a previous die 250 in the second direction, exposing the bond pad of the lowermost or the previous die 250. After all dies 250 have been bonded to the package 200, forming the reverse-shingled sub-stack 600, the wire segment 232b may be formed, connecting the bond pads of each die 250 of the reverse-shingled sub-stack 600.

FIG. 7 illustrates the package 200 after (i) bonding the reverse-shingled sub-stack 700 of the die stack 230 to the top die of the shingled sub-stack 400, (ii) bonding the wire segment 232a from the package substrate 210 to each of the dies 250 and the bridging chip 236 in the reverse-shingled sub-stack 700, and (iii) extending the wire segment 232b from the reverse-shingled sub-stack 600 to the bridging chip 236. Bonding the reverse-shingled sub-stack 700 to the top die of the shingled sub-stack 400 may include bonding a lowermost die 250 (e.g., a bottom or first die) to the upper surface of the top die of the sub-stack 400. The lowermost die 250 of the reverse-shingled shingled sub-stack 700 may be offset in the first direction from the top die of the shingled sub-stack 400. Next, the dies 250 may be consecutively bonded to the reverse-shingled sub-stack 700 offset from the lowermost or a previous die 250 in the second direction, exposing the bond pad of the lowermost or the previous die 250.

After all dies 250 have been bonded to the package 200, the bridging chip 236 may be bonded to an uppermost die 250 (e.g., a top or last die) offset from the uppermost die 250 in the second direction and exposing the bond pad of the uppermost die 250. After the bridging chip 236 has been bonded to the uppermost die 250, forming the reverse-shingled sub-stack 700, the wire segment 232a may be formed. The wire segment 232a may connect one of the bond pads on the upper surface of the package substrate 210 with the bond pad of each die 250 of the sub-stack 700 and the bond pad on the first end of the bridging chip 246. Further, the wire segment 232b may be extended to connect the bond pad on an uppermost die 250 of the reverse-shingled sub-stack 600 with the bond pad on the second end of the bridging chip 236, completing the circuit 232.

Figure 8:
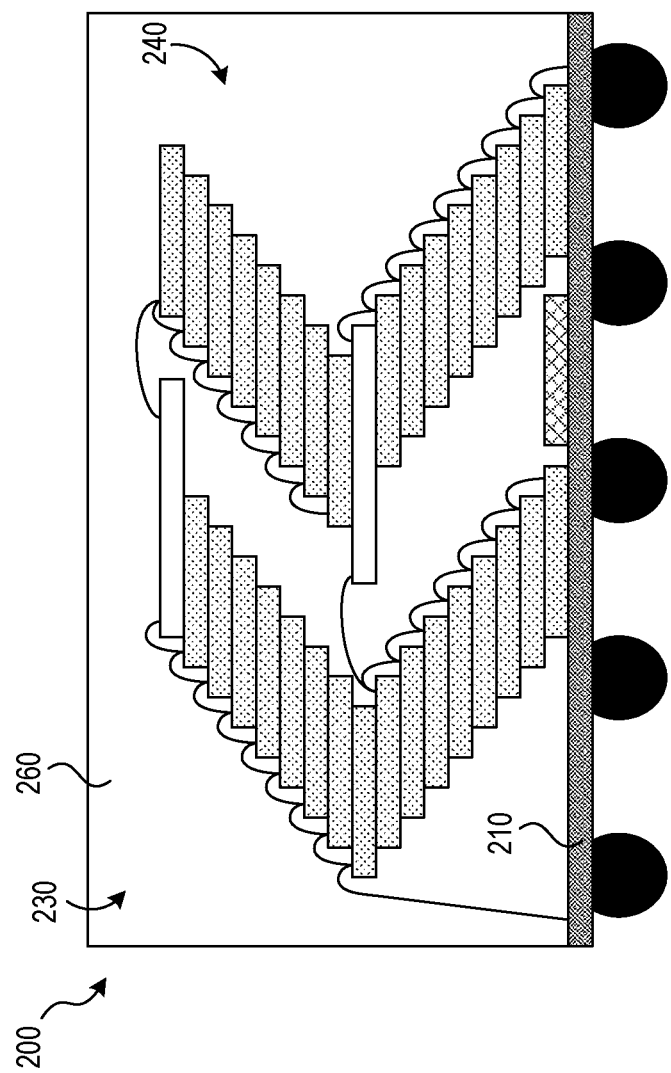

FIG. 8 illustrates the package 200 after a molding material has been applied over the controller 220 and die stacks 230, 240. The molding material may be formed by dipping the package 200, die stacks 230, 240 first, into a liquid molding material, removing the package 200 from the liquid molding material, and allowing the material to harden. In some embodiments the molding material may be applied over the package 200 while the package 200 is upright (as shown in FIG. 8). As illustrated, the molding material encases and insulates the upper surface of the package substrate 210 and exterior surfaces of the controller 220 and the dies 250.

Figure 12:
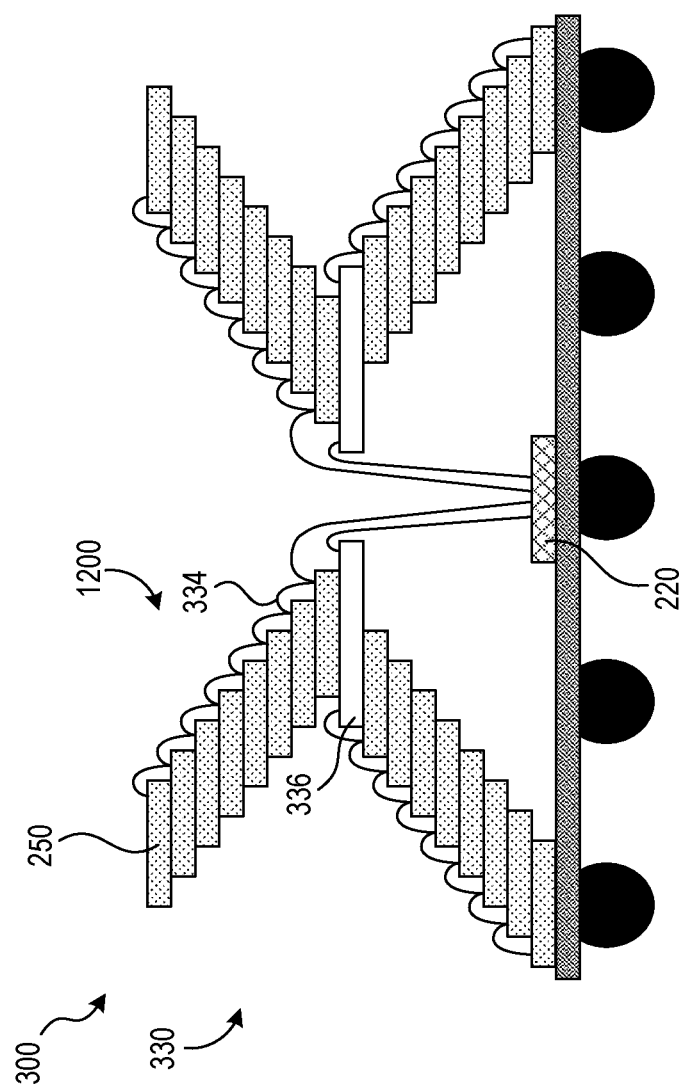

FIGS. 9-13 illustrate a process for producing at least the package 300 of FIG. 3 having through-stack bridge bonding in accordance with some embodiments of the present technology. The process may generally include preparing the package substrate 210 and forming the sub-stacks of the dies stacks 330, 340 in a counter clockwise order. For example, the sub-stacks can be formed in the following order: the reverse-shingled sub-stack (FIG. 9, 900), the shingled sub-stack (FIG. 10, 1000), the reverse-shingled sub-stack (FIG. 11, 1100), and the shingled sub-stack (FIG. 12, 1200). In some embodiments, the process may instead include forming the sub-stacks in a clockwise order (e.g., starting with the shingled sub-stack (FIG. 10, 1000) and ending with the reverse-shingled sub-stack (FIG. 11, 1100)). In some embodiments the process may instead include forming the sub-stacks in a "Z" order (e.g., the shingled sub-stack (FIG. 10, 1000), the reverse-shingled sub-stack (FIG. 11, 1100), the reverse-shingled sub-stack (FIG. 9, 900), and then the shingled sub-stack (FIG. 12, 1200). In some embodiments, the process may instead include forming the die stack 430, followed by forming the die stack 440. In further embodiments still, each of the die stacks 430, 440, excluding the wire segments 332a, 332b, 334, 342a, 342b, 344, can be formed off the package substrate 210 and placed on the package substrate. Then, the wire segments 332a, 332b, 334, 342a, 342b, 344 can be connected to the assembly.

In the illustrated process of FIGS. 9-13 the process may specifically include: (i) preparing the package substrate 210, (ii) bonding the reverse-shingled sub-stack (FIG. 9, 900) of the die stack 330 (FIG. 3) to the package substrate 210, (iii) bonding the wire segment 332a to the controller 220 and to the bridging chip 336, (iv) bonding the wire segment 332b to each of the dies 250 in the reverse-shingled sub-stack 900 and to the bridging chip 336, (v) bonding the shingled sub-stack (FIG. 10, 1000) of the die stack 340 (FIG. 3) to the package substrate 210, (vi) bonding the wire segment 342a to the controller 220 and to the bridging chip 346, (vii) bonding the wire segment 342b to each of the dies 250 in the shingled sub-stack 1000 and to the bridging chip 346, (viii) bonding the shingled sub-stack (FIG. 11, 1100) of the die stack 340 to the bridging chip 346, (ix) bonding the wire 344 to each die 250 of the reverse-shingled sub-stack 1100 and to the controller 220, (x) bonding the shingled sub-stack (FIG. 12, 1200) of the die stack 330 to the bridging chip 336, (xi) bonding the wire 334 to each die 250 of the shingled sub-stack 1200 and to the controller 220, and (x) adding a molding material over the package 300 to form the mold material 360.

Figure 9:
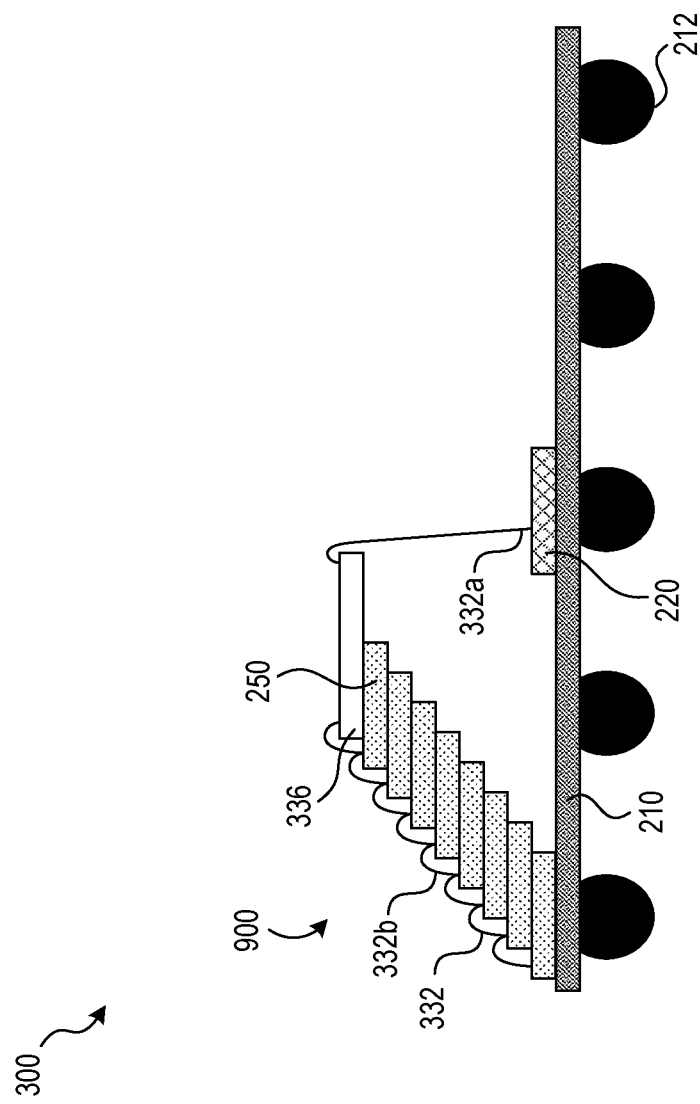
FIGS. 9-13 illustrate a process for producing at least the semiconductor package of FIG. 3, in accordance with some embodiments of the present technology.

FIG. 9 illustrates the package 300 after (i) preparing the package substrate 210, (ii) bonding the reverse-shingled sub-stack 900 of the die stack 330 (FIG. 3) to the package substrate 210, (iii) bonding the wire segment 332a to the controller 220 and to the bridging chip 336, and (iv) bonding the wire segment 332b to each of the dies 250 in the reverse-shingled sub-stack 900 and to the bridging chip 336. Preparing the package substrate 210 may include bonding the connectors 212 to the package substrate 210 at the bond pads on the lower surface of the package substrate 210 and bonding the controller 220 to the upper surface of the package substrate 210. Bonding the reverse-shingled sub-stack 900 to the package substrate 210 may first include bonding a lowermost die 250 (e.g., a bottom or first die) to the upper surface of the package substrate 210 adjacent to the controller 220.

Next, the dies 250 may be consecutively bonded to the reverse-shingled sub-stack 900 offset from the lowermost or a previous die 250 in the second direction, exposing the bond pad of the lowermost or the previous die 250. After all dies 250 have been bonded to the package 300, the bridging chip 336 may be bonded to an uppermost die 250 (e.g., a top or last die) offset from the uppermost die 250 in the second direction and exposing the bond pad of the uppermost die 250. After the bridging chip 336 has been bonded to the uppermost die 250, forming the reverse-shingled sub-stack 900, the wire segments 332a, 332b may be formed. The wire segment 332a may connect the controller 220 to the second end bond pad of the bridging chip 336 and the wire segment 332b may connect each die 250 of the sub-stack 900 to the first end bond pad of the bridging chip 336, respectively, completing the circuit 332.

Figure 10:
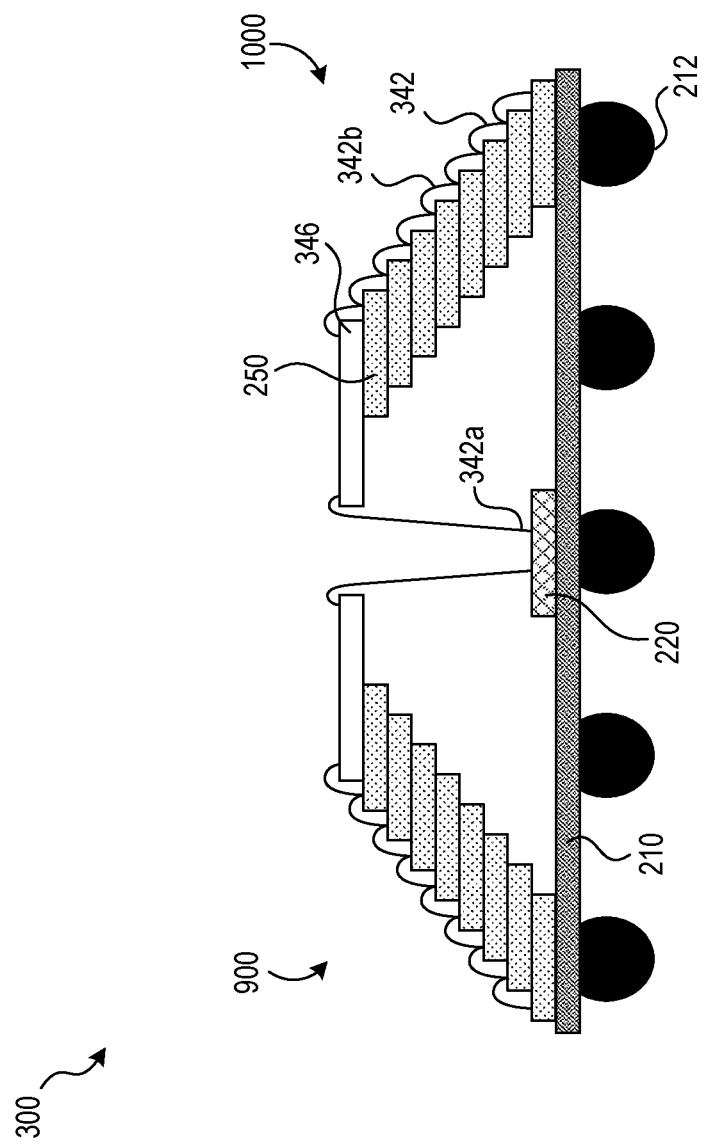

FIG. 10 illustrates the package 300 after (i) bonding the shingled sub-stack 1000 of the die stack 340 (FIG. 3) to the package substrate 210, (ii) bonding the wire segment 342a to the controller 220 and to the bridging chip 346, and (iii) bonding the wire segment 342b to each of the dies 250 in the shingled sub-stack 1000 and to the bridging chip 346. Bonding the shingled sub-stack 1000 to the package substrate 210 may first include bonding a lowermost die 250 (e.g., a bottom or first die) to the upper surface of the package substrate 210 adjacent to the controller 220, opposite the reverse-shingled sub-stack 900. Next, the dies 250 may be consecutively bonded to the shingled sub-stack 1000 offset from the lowermost or a previous die 250 in the first direction, exposing the bond pad of the lowermost or the previous die 250.

After all dies 250 of the sub-stack 1000 have been bonded to the package 300, the bridging chip 346 may be bonded to an uppermost die 250 (e.g., a top or last die) offset from the uppermost die 250 in the first direction and exposing the bond pad of the uppermost die 250. After the bridging chip 346 has been bonded to the uppermost die 250, forming the reverse-shingled sub-stack 1000, the wire segments 342a, 342b may be formed. The wire segment 342a may connect the controller 220 to the second end bond pad of the bridging chip 346 and the wire segment 342b may connect each die 250 of the sub-stack 1000 to the first end bond pad of the bridging chip 346, respectively, completing the circuit 342.

FIG. 11 illustrates the package 300 after (i) bonding the reverse-shingled sub-stack 1100 of the die stack 340 to the bridging chip 346, and (ii) bonding the wire 344 from the controller 220 to each die 250 of the reverse-shingled sub-stack 1100. Bonding the reverse-shingled sub-stack 1100 to the bridging chip 346 may first include bonding a lowermost die 250 (e.g., a bottom or first die) to the upper surface of the bridging chip 346. The lowermost die 250 may be offset in the second direction from the second end of the bridging chip 346 and offset in the first direction from the second end of the bridging chip 346 (e.g., the lowermost die 250 may be offset from both ends of the bridging chip 346 or generally centered on the bridging chip 346). Next, the dies 250 may be consecutively bonded to the reverse-shingled sub-stack 1100 offset from the lowermost or a previous die 250 in the second direction, exposing the bond pad of the lowermost or the previous die 250. After all dies 250 have been bonded to the package 300, forming the reverse-shingled sub-stack 1100, the wire 344 may be formed, connecting the controller 220 to the bond pads of each die 250 of the sub-stack 1100.

FIG. 12 illustrates the package 300 after (i) bonding the shingled sub-stack 1200 of the die stack 330 to the bridging chip 336, and (ii) bonding the wire 334 from the controller 220 to each die 250 of the shingled sub-stack 1200. Bonding the shingled sub-stack 1200 to the bridging chip 336 may first include bonding a lowermost die 250 (e.g., a bottom or first die) to the upper surface of the bridging chip 336. The lowermost die 250 may be offset in the first direction from the second end of the bridging chip 336 and offset in the second direction from the first end of the bridging chip 336 (e e.g., the lowermost die 250 may be offset from both ends of the bridging chip 336 or generally centered on the bridging chip 336). Next, the dies 250 may be consecutively bonded to the shingled sub-stack 1200 offset from the lowermost or a previous die 250 in the first direction, exposing the bond pad of the lowermost or the previous die 250. After all dies 250 have been bonded to the package 300, forming the shingled sub-stack 1200, the wire 334 may be formed, connecting the controller 220 to the bond pads of each die 250 of the sub-stack 1200.

Figure 13:
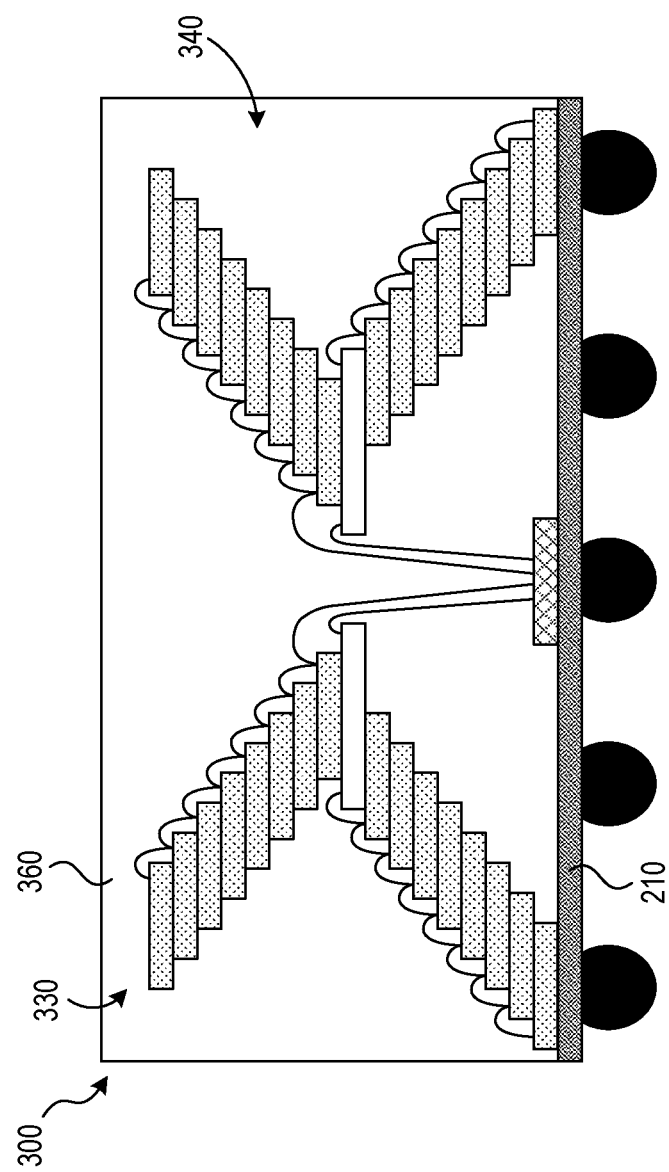

FIG. 13 illustrates the package 300 after a molding material has been applied over the controller 220 and die stacks 330, 340. The molding material may be formed by dipping the package 300, die stacks 330, 340 first, into a liquid molding material, removing the package 300 from the liquid molding material, and allowing the material to harden. In some embodiments the molding material may be applied over the package 300 while the package 300 is upright (as shown in FIG. 13). As illustrated, the molding material encases and insulates the upper surface of the package substrate 210 and exterior surfaces of the controller 220 and the dies 250.

Figure 14:
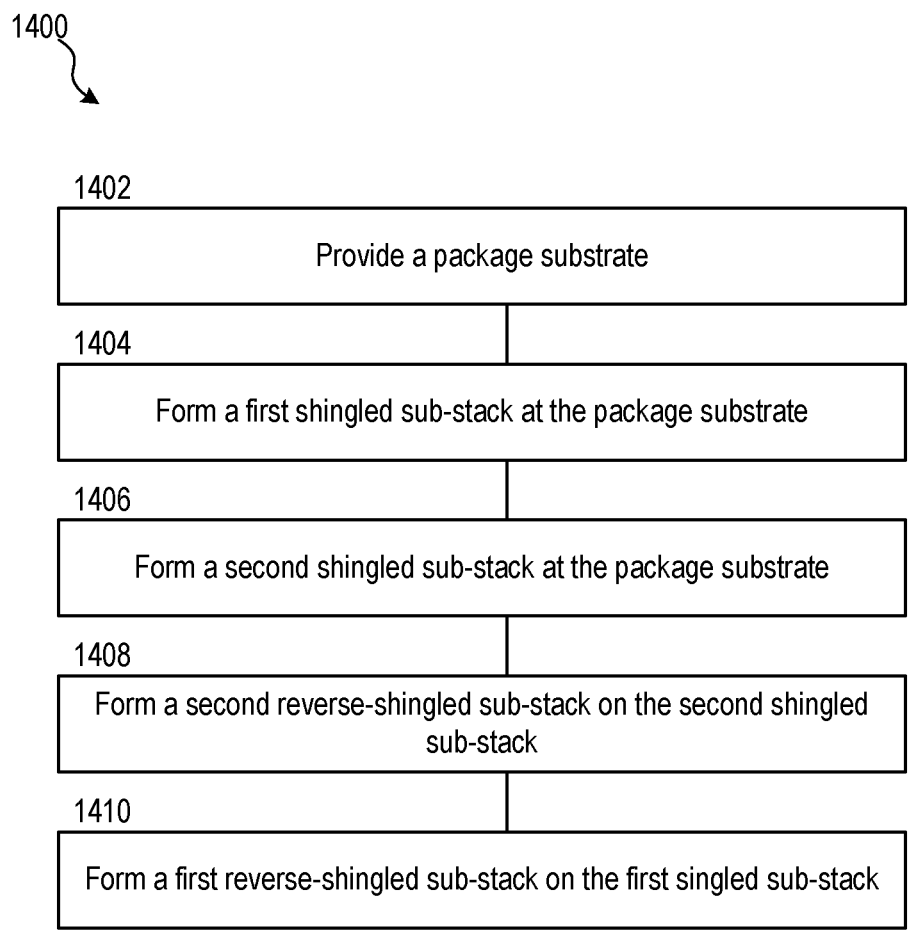
FIG. 14 is a flow diagram illustrating a process for producing at least the semiconductor package of FIG. 2, in accordance with some embodiments of the present technology.

FIG. 14 is a flow diagram illustrating a process 1400 for producing at least the package 200 of FIG. 2 having cross stack bridge bonding in accordance with some embodiments of the present technology. The operations of process 1400 are intended for illustrative purposes and are non-limiting. In some embodiments, for example, the process 1400 can be accomplished with one or more additional operations not described, without one or more operations described, or with the operations in an alternative order. As shown in FIG. 14, the process may include: providing a package substrate (process portion 1402); forming a first shingled sub-stack at the package substrate (process portion 1404); forming a second shingled sub-stack at the package substrate (process portion 1406); forming a second reverse-shingled sub-stack on the second shingled sub-stack (process portion 1408); and forming a first reverse-shingled sub-stack on the first shingled sub-stack (process portion 1410).

In process portion 1402, a package substrate can be provided. In process portion 1404, a first shingled sub-stack can be formed at the package substrate. Forming the first shingled sub-stack can comprise (i) bonding a first die of the first shingled sub-stack to the package substrate and consecutive dies to the first die with each consecutive die above and shingled relative to a previous die, and (ii) bonding a wire between the first die and each consecutive die of the first shingled sub-stack.

In process portion 1406, a second shingled sub-stack can be formed at the package substrate. Forming the second shingled sub-stack at the package substrate can comprise (i) bonding a first die of the second shingled sub-stack to the package substrate and consecutive dies to the first die with each consecutive die above and shingled relative to a previous die, (ii) bonding a first bridging chip to a last die of the consecutive dies of the second shingled sub-stack, (iii) bonding a wire between the package substrate and the first die, each consecutive die, and the first bridging chip of the second shingled sub-stack, and (iv) bonding a wire between the first bridging chip and the first shingled sub-stack.

In process portion 1408, a second reverse-shingled sub-stack can be formed on the second shingled sub-stack. Forming can comprise (i) bonding a first die of the second reverse-shingled sub-stack to the first bridging chip and consecutive dies to the first die with each consecutive die above and reverse-shingled relative to a previous die, and (ii) bonding a wire between the first die and each consecutive die of the second reverse-shingled sub-stack.

In process portion 1410, a first reverse-shingled sub-stack can be formed on the first shingled sub-stack. Forming can comprise (i) bonding a first die of the first reverse-shingled sub-stack and consecutive dies to the first die with each die above and reverse-shingled relative to a previous die, (ii) bonding a second bridging chip to a last die of the consecutive dies of the first reverse-shingled sub-stack, (iii) bonding a wire between the package substrate and the first die, each consecutive die, and the second bridging chip of the first reverse-shingled sub-stack, and (iv) bonding a wire between the second bridging chip and the second reverse-shingled sub-stack.

FIG. 15 is a flow diagram illustrating a process 1500 for producing at least the package 300 of FIG. 3 having through stack bridge bonding in accordance with some embodiments of the present technology. The operations of process 1500 are intended for illustrative purposes and are non-limiting. In some embodiments, for example, the process 1500 can be accomplished with one or more additional operations not described, without one or more operations described, or with the operations in an alternative order. As shown in FIG. 15, the process may include: providing a package substrate having a controller (process portion 1502); forming a shingled die stack at the package substrate, the shingled die stack having a first die, consecutive dies, and a bridging chip (process portion 1504); bonding a first wire segment between the controller and a first end of the bridging chip (process portion 1506); bonding a second wire segment between a second end of the bridging chip, the first die of the shingled die stack, and each consecutive die of the shingled die stack (process portion 1508); forming a reverse-shingled die stack on the shingled die stack, the reverse-shingled die stack having a second die, consecutive dies, and a second bridging chip (process portion 1510); and bonding a third wire segment between the controller, the second die of the reverse-shingled die stack, and each consecutive die of the reverse-shingled die stack (process portion 1512).

In process portion 1502, a package substrate having a controller can be provided. In process portion 1504, forming the shingled die stack at the package substrate can comprise (i) bonding a first die to the package substrate and consecutive dies to the first die with each consecutive die above and shingled relative to a previous die, and (ii) bonding the bridging chip to a last die of the consecutive dies of the shingled die stack. In process portion 1506, the first wire segment can be bonded between the controller and the first end of the bridging chip. In process portion 1508, the second wire segment can be bonded between the second end of the bridging chip, the first die of the shingled die stack, and each consecutive die of the shingled die stack. In process portion 1510, forming the reverse-shingled die stack can comprise (i) bonding the second die to the bridging chip, and (ii) bonding consecutive dies to the second die with each consecutive die above and reverse-shingled relative to a previous die. In process portion 1512, the third wire segment can be bonded between the controller, the second die of the reverse-shingled die stack, and each consecutive die of the reverse-shingled die stack.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:
1. A semiconductor device package, comprising:
   a package substrate including an upper surface;
   a controller at the upper surface;
   a die stack at the upper surface including multiple dies, having:
      a shingled sub-stack of semiconductor dies,
      a reverse-shingled sub-stack of semiconductor dies, and
      a bridging chip bonded between the shingled sub-stack and the reverse-shingled sub-stack, and having an internal trace;
   a first wire segment between the controller and a first end of the bridging chip;
   a second wire segment between a second end of the bridging chip and each semiconductor die of the shingled sub-stack, wherein the internal trace electrically couples the first and second wire segments; and
   a third wire segment bonded to the controller and further bonded to each semiconductor die of the reverse-shingled sub-stack.

2. The semiconductor device package of claim 1, wherein the controller comprises a first controller channel, and wherein the first controller channel corresponds to the semiconductor dies of the shingled sub-stack.

3. The semiconductor device package of claim 1, wherein the die stack is on a first side of the controller, and wherein the semiconductor device package further comprises:
   a second die stack at the upper surface on a second side of the controller opposite the first side, the second die stack including multiple dies and having:
      a second reverse-shingled sub-stack of semiconductor dies,
      a second shingled sub-stack of semiconductor dies, and
      a second bridging chip bonded between the second reverse-shingled sub-stack and the second shingled sub-stack, and having a second internal trace;
   a fourth wire segment between the controller and the second bridging chip;
   a fifth wire segment between a second end of the second bridging chip and each semiconductor die of the second reverse-shingled sub-stack, wherein the second internal trace electrically couples the fourth and fifth wire segments; and
   a sixth wire segment bonded between the controller and each semiconductor die of the second shingled sub-stack.

4. The semiconductor device package of claim 3, wherein the controller comprises a second controller channel, and wherein the second controller channel corresponds to the semiconductor dies of the second reverse-shingled sub-stack.

5. The semiconductor device package of claim 1 further comprising:
   a second shingled sub-stack, including:
      a second bridging chip bonded to an uppermost die of the reverse-shingled sub-stack, and
      a first semiconductor die bonded to the second bridging chip and consecutive dies bonded above and shingled relative to the first die or to a previously bonded die.

6. The semiconductor device package of claim 1, wherein a region of the upper surface opposite the die stack from the controller is free of any bond pads to which a wire segment is bonded.

7. The semiconductor device package of claim 1, wherein the bridging chip comprises:
    an upper surface;
    a first exposed area of the upper surface at the first end;
    a second exposed area of the upper surface at the second end; and
    a bond pad at each of the first exposed area and the second exposed area, wherein the internal trace electrically connects the bond pads.

8. The semiconductor device package of claim 1, wherein the bridging chip is a semiconductor die.

9. The semiconductor device package of claim 1, wherein at least a portion of the bridging chip is vertically aligned with the controller.

10. A semiconductor device package, comprising:
    a package substrate including an upper surface;
    a controller at the upper surface;
    a shingled die stack at the upper surface, including:
        multiple semiconductor dies,
        a first bridging chip bonded to at least one of the semiconductor dies,
        a first wire segment bonded between the controller and a first end of the first bridging chip, and
        a second wire segment bonded between a second end of the first bridging chip and each semiconductor die of the shingled die stack; and
    a reverse-shingled die stack at the upper surface, including:
        multiple semiconductor dies,
        a second bridging chip bonded to at least one of the semiconductor dies, a third wire segment bonded between the controller and a first end of the second bridging chip, and
        a fourth wire segment bonded between a second end of the second bridging chip and each semiconductor die of the reverse-shingled die stack.

11. The semiconductor device package of claim 10, wherein a mold material is at the upper surface of the package substrate and at least partially encasing the controller, the shingled die stack, and the reverse-shingled die stack.

12. The semiconductor device package of claim 10, wherein the shingled die stack is on a first side of the controller and the reverse-shingled die stack is on a second side of the controller, wherein the second side is opposite the first side.

13. The semiconductor device package of claim 10, wherein the controller comprises a first controller channel, and wherein the first controller channel corresponds to the semiconductor dies of the shingled die stack.

14. The semiconductor device package of claim 10 further comprising a third die stack at the upper surface, including:
    multiple semiconductor dies, one of which being an uppermost die,
    a third bridging chip bonded to the uppermost die,
    a fifth wire segment bonded between the controller and a first end of the third bridging chip, and
    a sixth wire segment bonded between a second end of the third bridging chip and each semiconductor die of the third die stack.

15. The semiconductor device package of claim 10, wherein a first region of the upper surface opposite the shingled die stack from the controller and a second region of the upper surface opposite the reverse-shingled die stack from the controller are free of any bond pads to which a wire segment is bonded.

16. The semiconductor device package of claim 10 further comprising a dedicated wire between the upper surface of the package substrate and the controller.

17. The semiconductor device package of claim 10, wherein the shingled die stack further includes:
    a fifth wire segment bonded between the controller and the first end of the first bridging chip, and
    a sixth wire segment bonded between the second end of the first bridging chip and each semiconductor die of the shingled die stack.

18. The semiconductor device package of claim 10, wherein the first and second bridging chip each comprise:
    an upper surface;
    a first exposed area of the upper surface at the first end;
    a second exposed area of the upper surface at the second end;
    a bond pad at each of the first exposed area and the second exposed area; and
    an internal trace electrically connecting the bond pads.

19. The semiconductor device package of claim 10, wherein a one of the semiconductor dies of the shingled is an uppermost die, and wherein the first bridging chip is bonded to the uppermost die.

20. A method of manufacturing a semiconductor package, comprising:
    providing a package substrate having a controller;
    forming a shingled die stack at the package substrate, forming comprising:
        bonding a first die to the package substrate and consecutive dies to the first die with each consecutive die above and shingled relative to a previous die, and
        bonding a bridging chip to a last die of the consecutive dies;
    bonding a first wire segment between the controller and a first end of the bridging chip;
    bonding a second wire segment between a second end of the bridging chip, the first die of the shingled die stack, and each consecutive die of the shingled die stack;
    forming a reverse-shingled die stack on the shingled die stack, forming comprising:
        bonding a second die to the bridging chip, and
        bonding consecutive dies to the second die with each consecutive die above and reverse-shingled relative to a previous die; and
    bonding a third wire segment between the controller, the second die of the reverse-shingled die stack, and each consecutive die of the reverse-shingled die stack.

* * * * *